(12) United States Patent
Shimizu et al.

(10) Patent No.: US 7,541,903 B2
(45) Date of Patent: Jun. 2, 2009

(54) SWITCH FOR VEHICLES

(75) Inventors: Masaru Shimizu, Kyoto (JP); Kiyotaka Sasanouchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/176,682

(22) Filed: Jul. 21, 2008

(65) Prior Publication Data

US 2009/0051409 A1  Feb. 26, 2009

(30) Foreign Application Priority Data

Aug. 24, 2007  (JP) ............................. 2007-217944

(51) Int. Cl.
*H01H 9/00* (2006.01)
*H01H 3/14* (2006.01)

(52) U.S. Cl. .................. 335/205; 338/32 R; 338/32 H; 324/207.11; 324/207.26; 200/61.89

(58) Field of Classification Search ......... 335/205–207; 338/32 R, 32 H; 324/207.11, 207.26; 200/61.89–61.9
See application file for complete search history.

(56) References Cited

FOREIGN PATENT DOCUMENTS

JP    2006-92777 A    4/2006
WO  WO 2007012948 A1 *  2/2007

* cited by examiner

*Primary Examiner*—Ramon M Barrera
(74) *Attorney, Agent, or Firm*—RatnerPrestia

(57) ABSTRACT

Provided is a switch for vehicles, including a first switching device which performs the electrical connection/disconnection between a battery and a stop lamp and a second switching device connected to a control device which opens and closes the first switching device based on the magnitude of the magnetism of a magnet mounted on an operating body. Various controls such as auto-cruise control and so on as well as the turn on/off of the stop lamp can be simultaneously performed by the one magnet mounted on the operating body of the switch for vehicles.

6 Claims, 5 Drawing Sheets

SWITCH FOR VEHICLES

BACKGROUND OF THE INVENTION

1. Field of the Invention

The present invention relates to a switch for vehicles, which is used for controlling the turn-on/off of a stop lamp when operating a brake pedal of a vehicle.

2. Description of the Related Art

Recently, a pressing-operation-type switch for vehicles is frequently used for controlling a stop lamp in accordance with the operation of a brake pedal. Specifically, the switch for vehicles turns on the stop lamp when the brake pedal is stepped on, and turns off the stop lamp when the brake pedal is not stepped on.

Such a conventional switch for vehicles will be described with reference to FIGS. 4 and 5.

FIG. 4 is a cross-sectional view of a conventional switch for vehicles. In FIG. 4, case 1 is formed in a box shape of which the top surface is opened and is formed of insulating resin. Operating body 2 is housed in case 1 so as to vertically move. Further, operating body 2 has magnet 3 mounted on a lower left side surface thereof.

A plurality of terminals 4 are formed of conductive metal. Wiring substrate 5 has a plurality of wiring patterns (not shown) formed on the right and left surfaces thereof. Wiring substrate 5 is disposed at the left side wall of case 1, and the upper ends of terminals 4 are connected to the wiring patterns of wiring substrate 5 through soldering or the like. Further, the lower ends of terminals 4 project downward from the bottom surface of case 1.

Wiring substrate 5 has detection device 6 such as a hall element and switching device 7 such as a power transistor formed on one surface thereof facing magnet 3. Further, control device 8 composed of an operational amplifier and a plurality of fixed resistors is formed on the surface of wiring substrate 5. Detection device 6 and switching device 7 are connected to control device 8.

Cover 10 formed of insulating resin covers the opening portion of the top surface of case 1. Further, coil-shaped return spring 9 is mounted in a state where it is bent between the lower surface of operating body 2 and the bottom surface of case 1. Return spring 9 biases operating body 2 upward, and the upper end of operating shaft 2A of operating body 2 projects upward from hollow cylindrical portion 10A formed in the center of the top surface of cover 10.

Movable contact 11 is formed of a conductive metal thin plate such as copper alloy. A plurality of fixed contacts 12 formed of copper alloy are planted into the right inner side wall of case 1. Further, the upper end of movable contact 11 is mounted and fixed to a lower right side surface of operating body 2, and the lower end of movable contact 11, which is set to be bent, is elastically contacted with the right inner side wall of case 1.

FIG. 5 is a side view of essential parts of a brake pedal using the conventional switch for vehicles. In FIG. 5, conventional switch 13 for vehicles constructed in the above-described manner is mounted in front of brake pedal 14 of a vehicle in a state where operating shaft 2A of operating body 2 is pressed by arm 14A. Further, the plurality of terminals 4 projecting from the bottom surface of case 1 are connected to a stop lamp, an ignition switch, a battery and so on through connector 15 and lead wires. Further, the lower ends of fixed contacts 12 projecting from the bottom surface of case 1 are connected to electronic circuits (not shown) of the vehicle.

In a state where brake pedal 14 is not stepped on, operating shaft 2A of operating body 2 is pressed downward while bending return spring 9, and magnet 3 mounted on the left side surface of operating body 2 is moved downward. Then, the center of detection device 6 disposed to face the center of magnet 3 is significantly separated from each other, and the magnetism of magnet 3 which is detected by detection device 6 decreases.

Control device 8 connected to detection device 6 controls switching device 7 based on the magnitude of the magnetism (magnetic flux density) detected by detection device 6. That is, when the magnetic flux density is equal to or more than a predetermined value, control device 8 switches switching device 7 into a close state. When the magnetic flux density is less than the predetermined value, control device 8 switches switching device 7 into an open state. Accordingly, in a state where operating body 2 is pressed, switching device 7 is set in the open state, and the stop lamp is turned off.

In a state where operating shaft 2A is pressed, movable contact 11 mounted on the right side surface of operating body 2 is also moved downward. Further, the lower end of movable contact 11 is elastically contacted with fixed contacts 12 such that fixed contacts 12 are electrically connected through movable contact 11. Accordingly, various functions controlled by the electronic circuits of the vehicle are operated. For example, a so-called auto-cruise device which constantly maintains the travel speed of the vehicle regardless of whether an accelerator pedal is stepped on or not is operated.

When brake pedal 14 is stepped on, arm 14A is separated from operating shaft 2A such that the pressing force is canceled. Therefore, as shown in FIG. 5, operating body 2 is moved upward by the elastic restoring force of return spring 9. Then, magnet 3 mounted on the left side surface of operating body 2 is also moved upward in such a manner that magnet 3 and detection device 6 face each other. Accordingly, the magnetism of magnet 3 which is detected by detection device 6 increases. Then, control device 8 switches switching device 7 into the close state, and the stop lamp is turned on.

Simultaneously, movable contact 11 mounted on operating body 2 is slid upward while being elastically contacted, and the plurality of fixed contacts 12 are electrically disconnected. Therefore, the auto-cruise control of the vehicle is stopped.

As such, operating body 2 of switch 13 for vehicles is vertically moved by the operation of brake pedal 14, and the turn-on/off of the stop lamp is controlled by detection device 6 and magnet 3 mounted on the left side surface of operating body 2 such that the operation and stoppage of the auto-cruise device is controlled by movable contact 11 on the right side surface and fixed contacts 12. As the related art document related to the invention of the present application, Japanese Patent Unexamined Publication No. 2006-92777 is known.

In the conventional switch for vehicles, however, since the turn-on/off of the stop lamp is controlled by magnet 3 and detection device 6 and the operation and stoppage of the auto-cruise device are controlled by movable contact 11 and fixed contacts 12, the number of used components increases, and the construction of the switch becomes so complex that assembling takes a lot of time.

SUMMARY OF THE INVENTION

Accordingly, it is an object of the present invention to provide a switch for vehicles which can perform various controls through a simple construction.

The switch for vehicles according to the invention includes a first switching device which performs the electrical connection/disconnection between a battery and a stop lamp and a second switching device connected to a control device which opens and closes the first switching device based on the magnitude of the magnetism of a magnet mounted on an operating body. Since various controls such as auto-cruise control and so on as well as the turn on/off of the stop lamp can be simultaneously performed by the one magnet mounted on the operating body, it is possible to obtain a switch for vehicles which can perform various operations through a simple construction.

DETAILED DESCRIPTION OF PREFERRED EMBODIMENTS

Figure 1:
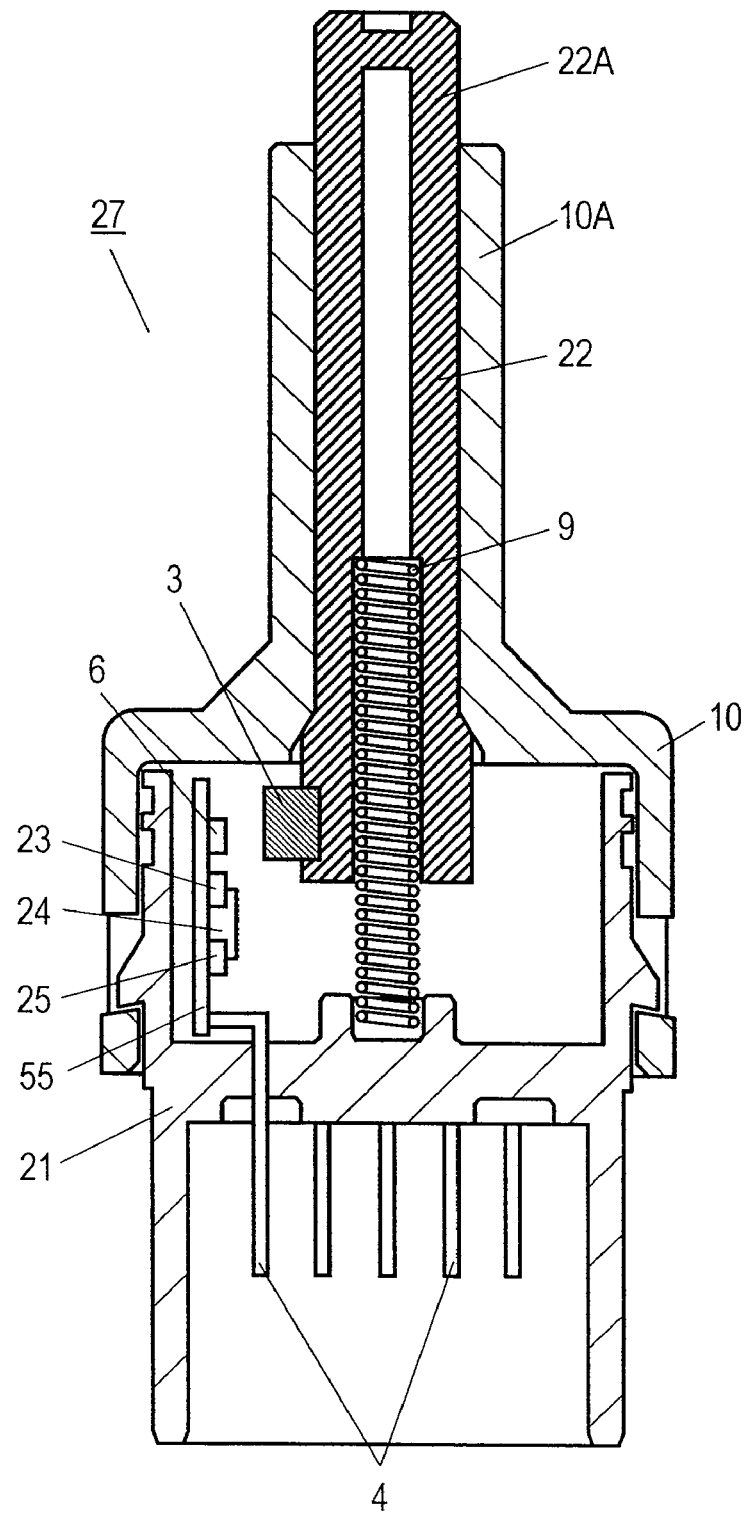
FIG. 1 is a cross-sectional view of a switch for vehicles according to a first embodiment of the invention.

Hereinafter, a first embodiment of the present invention will be described.

In the following descriptions, like reference numerals will be attached to the same components as those described in the related art, and the detailed descriptions thereof will be omitted.

First Embodiment

Figure 2:
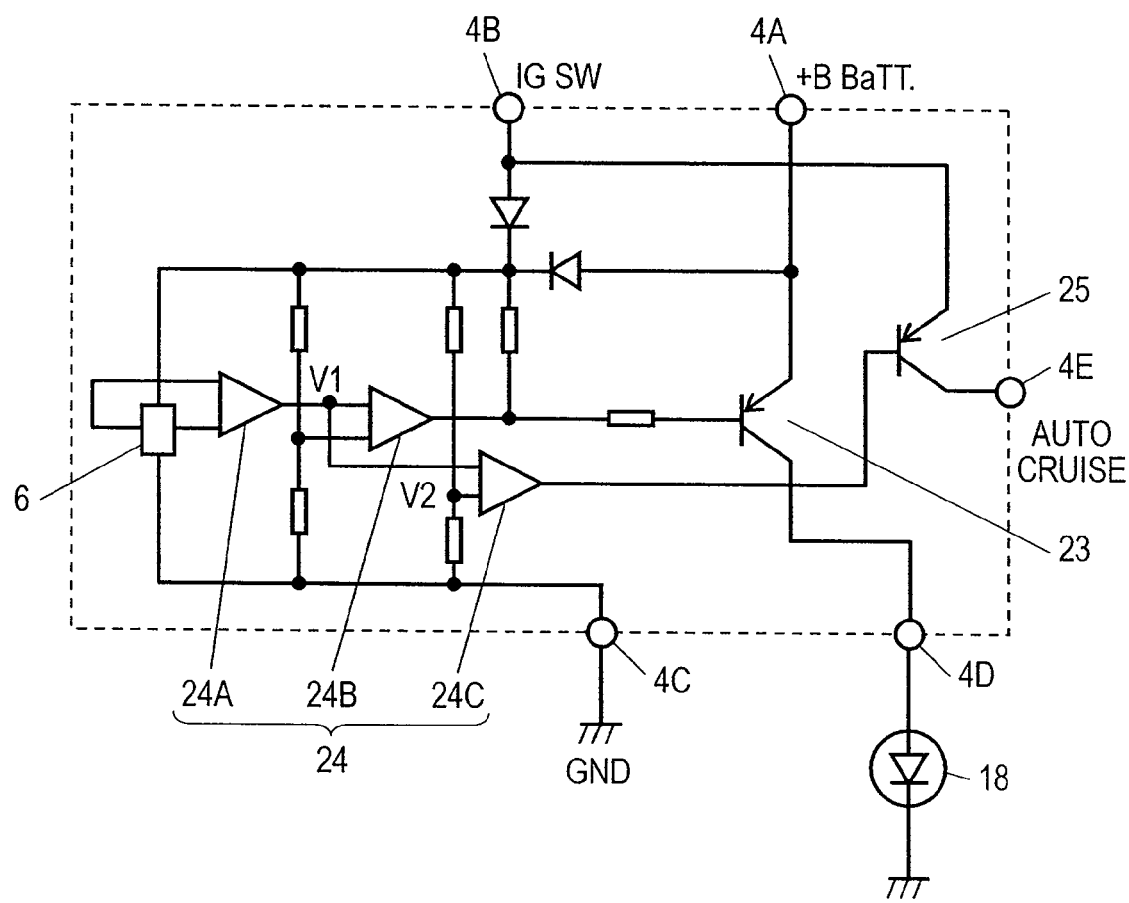
FIG. 2 is a circuit diagram of the switch for vehicles according to the first embodiment of the invention.

FIG. 1 is a cross-sectional view of a switch for vehicles according to the first embodiment of the invention. FIG. 2 is a circuit diagram of the switch for vehicles according to the first embodiment of the invention. In FIGS. 1 and 2, case 21 is formed in a box shape of which the top surface is opened, and is formed of insulating resin such as polybutylene terephthalate or ABS. Inside case 21, cylindrical operating body 22 which is formed of insulating resin is housed so as to vertically move. Further, operating body 22 has magnet 3 mounted on a lower left side surface thereof.

A plurality of terminals 4 are formed of conductive metal such as a copper alloy. Wiring substrate 55 has a plurality of wiring patterns (not shown) formed on the left and right surfaces thereof. Further, wiring substrate 55 is disposed at the left side wall of case 21, and the upper ends of terminals 4 are connected to the wiring patterns of wiring substrate 55 by soldering or the like. Further, the lower ends of terminals 4 project downward from the bottom surface of case 21.

Wiring substrate 55 has detection device 6 such as a hall element and a first switching device 23 such as a power transistor formed on one surface thereof facing magnet 3. Further, control device 24 is formed on the surface of wiring substrate 55, control device 24 including operational amplifier 24A for amplifying a voltage, operational amplifier 24B for comparing voltages, and a plurality of fixed resistors. Detection device 6 and the first switching device 23 are connected to control device 24.

A second switching device 25 such as a power transistor is connected to an operational amplifier 24C of control device 24, which is used for comparing voltages. Further, one side of the second switching device 25 is connected to terminal 4B for ignition-switch connection, and the other side thereof is connected to terminal 4E which is connected to an auto-cruise device and so on.

Detection device 6 and control device 24 are connected to terminal 4B and terminal 4A for battery connection and terminal 4C for ground connection, respectively. Further, the first switching device 23 is connected to terminal 4D for connection of stop lamp 18.

Cover 10 formed of insulating resin covers the opening portion of the top surface of case 21. Further, coil-shaped return spring 9 is mounted in a state where it is bent between the lower surface of operating body 22 and the bottom surface of case 21. Return spring 9 biases operating body 22 upward, and the upper end of an operating shaft 22A of operating body 22 projects upward from hollow cylindrical portion 10A formed in the center of the top surface of cover 10.

Figure 3:
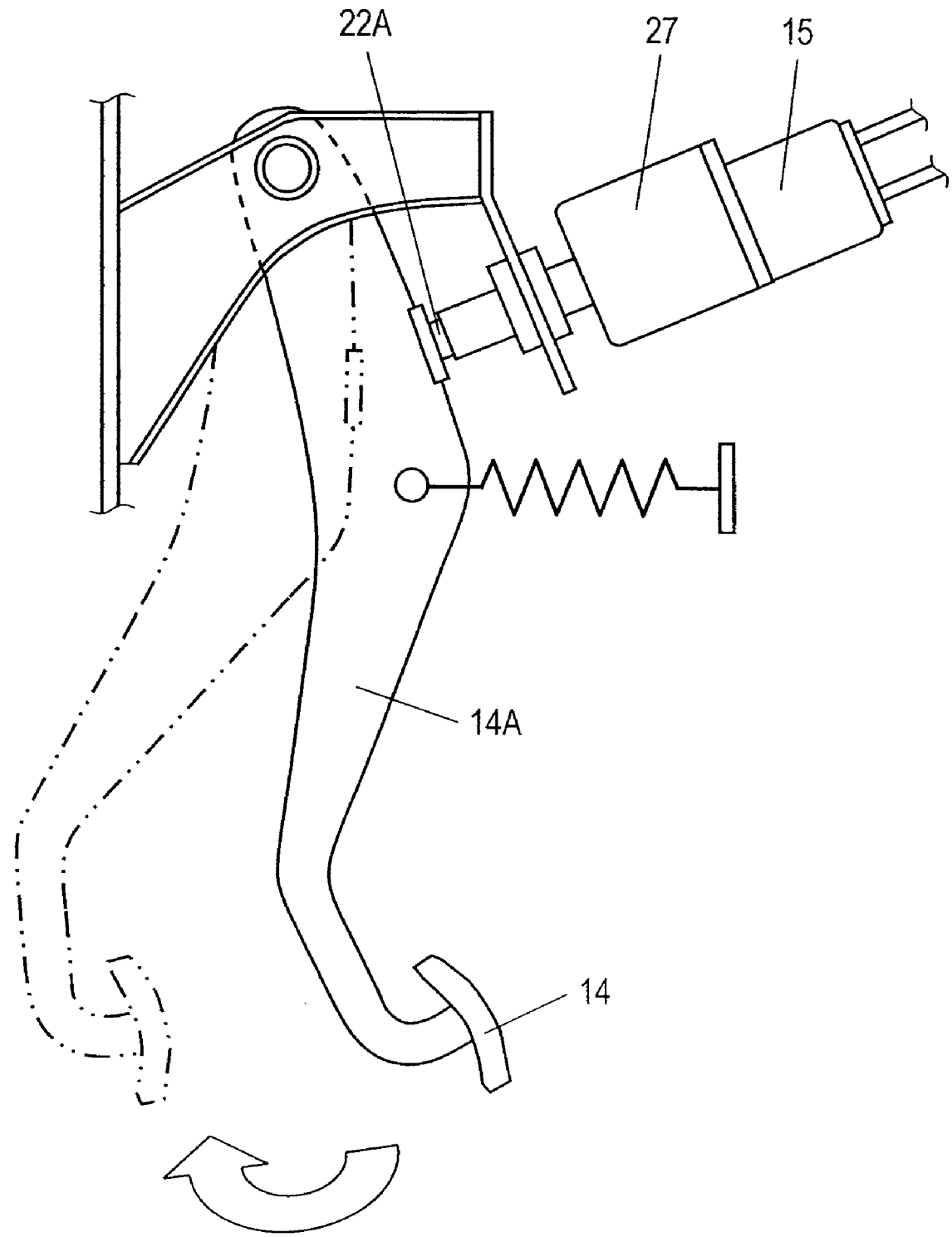
FIG. 3 is a side view of essential parts of a brake pedal using the switch for vehicles according to the first embodiment of the invention.
Figure 4:
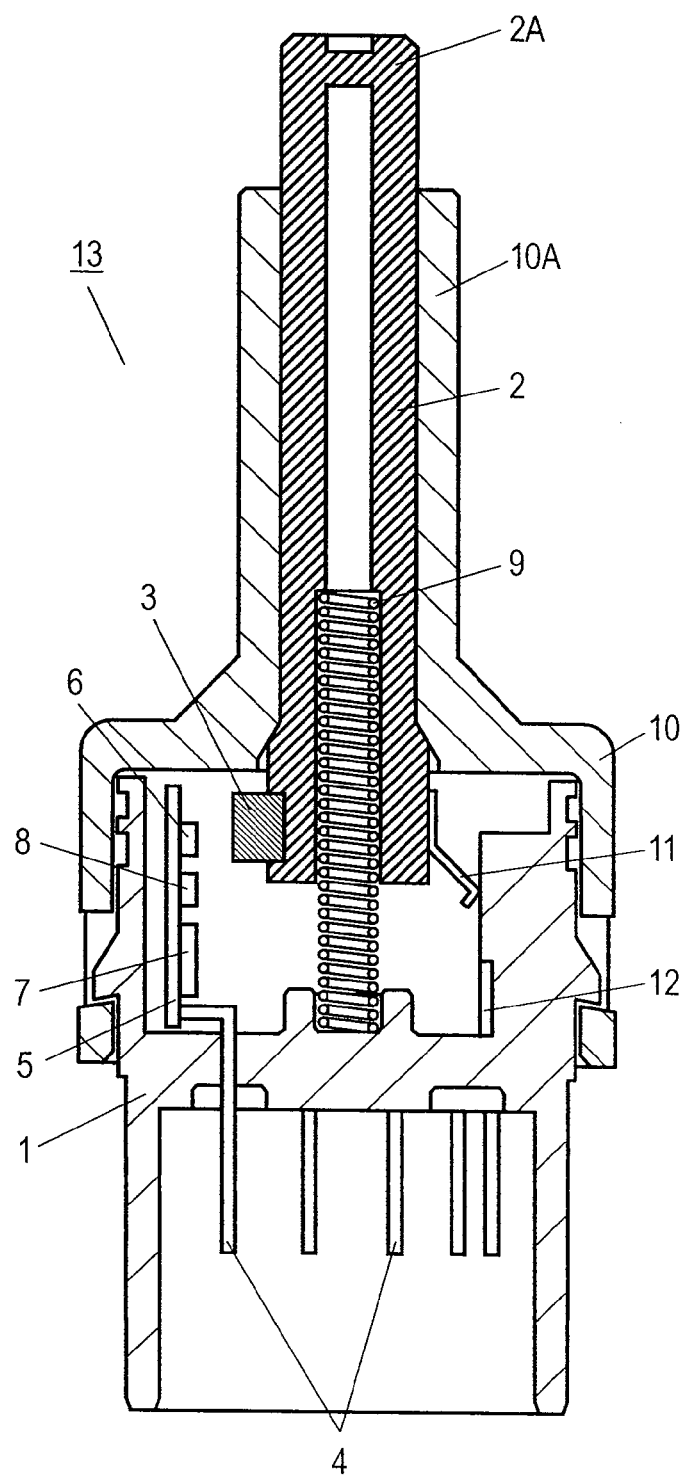
FIG. 4 is a cross-sectional view of a conventional switch for vehicles.
Figure 5:
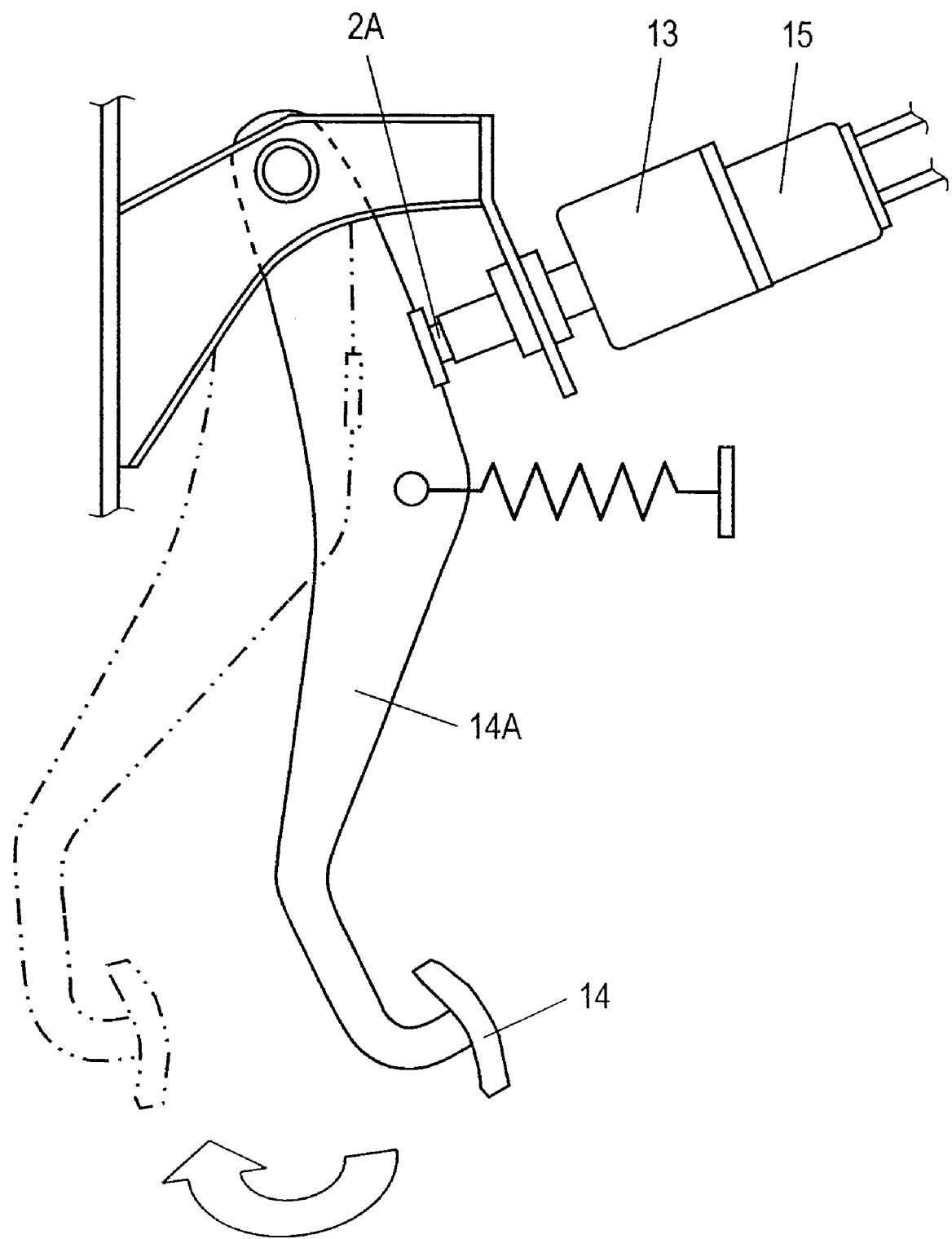
FIG. 5 is a side view of essential parts of a brake pedal using the conventional switch for vehicles.

FIG. 3 is a side view of essential parts of a brake pedal using the switch for vehicles according to the first embodiment of the invention. In FIG. 3, the switch 27 for vehicles according to the invention is mounted in front of brake pedal 14 of a vehicle in a state where the operating shaft 22A of operating body 22 is pressed by arm 14A. Further, the plurality of terminals 4 projecting from the bottom surface of case 21 are connected to stop lamp 18 (refer to FIG. 2) composed of a plurality of light emitting diodes, an ignition switch, a battery, electric circuits (not shown) of the vehicle and so on through connector 15 and lead wires.

As the ignition switch is turned on, an engine is activated, and power is supplied from terminal 4B (refer to FIG. 2). In this case, when brake pedal 14 is not stepped on, the operating shaft 22A of operating body 22 is pressed downward while bending return spring 9, and magnet 3 mounted on the left side surface of operating body 22 is also moved downward. Then, the center of detection device 6 disposed to face the center of magnet 3 is significantly separated from each other, and the magnetism of magnet 3 which is detected by detection device 6 decreases.

Control device 24 connected to detection device 6 controls the first switching device 23 based on the magnitude of the magnetism (magnetic flux density) detected by detection device 6. That is, when the magnetic flux density is equal to or more than a predetermined value, control device 24 switches the first switching device 23 into a close state. When the magnetic flux density is less than the predetermined value, control device 24 switches the first switching device 23 into an open state. Accordingly, in a state where operating body 22 is pressed, the first switching device 23 is set in the open state, and stop lamp 18 is turned off.

On the contrary, when the magnetism of magnet 3 is weak, control device 24 switches the second switching device 25 into the close state. When the magnetism of magnet 3 is strong, control device 24 switches the second switching device 25 into the open state. For example, when the second switching device 25 is set in the close state, the auto-cruise device is operated, which is connected from terminal 4E through the electric circuits of the vehicle so as to constantly maintain the travel speed of the vehicle.

When brake pedal 14 is stepped on, arm 14A is separated from the operating shaft 22A such that the pressing force is canceled. Therefore, as shown in FIG. 1, operating body 22 is moved upward by the elastic restoring force of return spring 9. Then, magnet 3 mounted on operating body 22 is also moved upward in such a manner that magnet 3 and detection device 6 face each other. Accordingly, the magnetism of magnet 3 which is detected by detection device 6 increases. Then, control device 24 switches the first switching device 23 into the close state, and stop lamp 18 is turned on.

Simultaneously, since control device 24 switches the second switching device 25 into the open state, the auto-cruise control of the vehicle is stopped.

As described above, operating body 22 of the switch 27 for vehicles is vertically moved by the operation of brake pedal 14, and control device 24 switches the first and second switching devices 23 and 25 based on the magnitude of the magnetism (magnetic flux density), detected by detection device 6, of magnet 3 which is mounted on the left side surface of operating body 22 such that the turn-on/off of stop lamp 18 and the operation and stoppage of the auto-cruise device are simultaneously performed.

In addition to the first switching device 23, the second switching device 25 is provided, and control device 24 switches the first and second switching devices 23 and 25 based on the magnitude of the magnetism of magnet 3. Then, since the turn-on/off of stop lamp 18 and the auto-cruise control are simultaneously performed by the one magnet 3 mounted on operating body 22, it is possible to perform various operations through the simple construction.

Further, when the turn-on/off of stop lamp 18 and the auto-cruise control are performed, the plurality of fixed resistors connected to the operational amplifiers 24B and 24C of control device 24 are regulated. Then, as voltages V1 and V2 shown in FIG. 2 are changed, the opening and closing timing of the first and second switching devices 23 and 25 can be adjusted. For example, when brake pedal 14 is stepped on, and if the voltage V1 is set to be smaller than the voltage V2 (V1<V2), the auto-cruise device is stopped after stop lamp 18 is turned off, and if the voltage V1 is set to be larger than the voltage V2 (V1>V2), stop lamp 18 is turned off after the auto-cruise device is stopped.

When the vehicle is stopped and the ignition switch is turned off so as to stop the engine, power is not supplied to the second switching device 25 connected to terminal 4B for ignition-switch connection. However, power is continuously supplied from the battery to detection device 6, control device 24, and the first switching device 23 connected to terminal 4A for battery connection. Therefore, in a state where the engine is stopped, the auto-cruise device is stopped. Even in this state, however, when brake pedal 14 is stepped on, the magnitude of the magnetism of magnet 3 is detected by detection device 6 as operating body 22 is vertically moved. Then, control device 24 switches the first switching device 23 such that stop lamp 18 is turned on.

According to the first embodiment, the second switching device 25 is provided, in addition to the first switching device 23 which performs the electrical connection/disconnection between the battery and stop lamp 18. Further, the second switching device 25 is connected to control device 24 which opens and closes the first switching device 23 based on the magnitude of the magnetism of magnet 3 mounted on operating body 22. Further, the auto-cruise control as well as the turn on/off of stop lamp 18 is simultaneously performed by one magnet 3 mounted on operating body 22. Therefore, it is possible to perform various operations through the simple construction.

In the above-described embodiment, it has been described that the second switching device 25 is connected to terminal 4E, and the auto-cruise device which constantly maintains the travel speed of the vehicle regardless of whether an accelerator pedal is stepped on or not is operated through the electronic circuits of the vehicle. In addition, however, other functions which are controlled by the electronic circuits of the vehicle may be operated by the second switching device 25. For example, the operation of brake pedal 14 may be detected by the second switching device 25.

Further, it has been described that detection device 6 and control device 24 are formed as separate electronic parts. However, as those components are integrated so as to be formed as a one-chip part, the switch for vehicles can be simply constructed, which makes it possible to reduce a manufacturing cost.

In the above-described embodiment, the pressing-operation-type switch for vehicles has been exemplified, which is mainly operated by the brake pedal. However, the invention can be also applied to various switches having a different operation type from the pressing operation type, such as a switch for opening and closing a door and a switch for swing or horizontally sliding an operating body.

The switch for vehicles according to the invention, which can achieve low power consumption and can reliably turn on/off the stop lamp, is effectively used for controlling the turn-on/off of a stop lamp of a vehicle.

What is claimed is:

1. A switch for vehicles comprising:
a box-shaped case;
an operating body that is housed in the case so as to vertically move;
a spring that biases the operating body upward;
a magnet that is mounted on the operating body;
a detection device that detects magnetism of the magnet;
a first switching device that performs an electrical connection/disconnection between a battery and a stop lamp;
a control device that is connected to the detection device so as to switch open and close the first switching device based on magnitude of the magnetism of the magnet; and
a second switching device,
wherein the second switching device is connected to the control device so as to perform control other than turn-on/off control of the stop lamp. the first switching device switches in accordance with a first threshold voltage generated by the control device and the second switching device switches in accordance with a second, different threshold voltage generated by the control device.

2. The switch of claim 1, wherein the second switching device supplies a control signal to an auto-cruise device.

3. The switch of claim 2, wherein
the operating body is operated,
the first switching device turns on, and the second switching device turns off,
the stop lamp is switched on by the first switching device, and
the control device is configured to stop the auto-cruise device.

4. The switch of claim 2, wherein the control device is configured to stop the stop lamp switched off by the first switching device after the auto-cruise device.

5. The switch of claim 1, wherein a switching threshold for the first switching device is based on a first position of the magnet relative to the detection device and a second switching threshold for the second switching device is based on a second, different position of the magnet relative to the detection device.

6. The switch of claim 3, wherein when an engine is stopped, the control device is configured to maintain a power supply to one connection of the first switching device and is configured to disconnect the power supply from the second switching device.

* * * * *